United States Patent
Ottens et al.

(10) Patent No.: US 7,119,884 B2
(45) Date of Patent: Oct. 10, 2006

(54) LITHOGRAPHIC APPARATUS AND DEVICE MANUFACTURING METHOD

(75) Inventors: Joost Jeroen Ottens, Vedlhoven (NL); Noud Jan Gilissen, Eindhoven (NL); Jeroen Starreveld, Udenhout (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/744,088

(22) Filed: Dec. 24, 2003

(65) Prior Publication Data

US 2005/0140962 A1   Jun. 30, 2005

(51) Int. Cl.
G03B 27/58 (2006.01)
G03B 27/62 (2006.01)

(52) U.S. Cl. .......................... 355/72; 355/75
(58) Field of Classification Search ............. 355/53, 355/72–76; 310/10, 12; 378/34, 35
See application file for complete search history.

(56) References Cited

U.S. PATENT DOCUMENTS

| | | | |
|---|---|---|---|
| 4,391,494 A | 7/1983 | Hershel | |
| 4,506,184 A * | 3/1985 | Siddall | 310/328 |
| 4,539,695 A | 9/1985 | La Fiandra | |
| 4,737,824 A * | 4/1988 | Sakai et al. | 355/53 |
| 5,986,743 A * | 11/1999 | Hanzawa | 355/53 |
| 6,257,564 B1 | 7/2001 | Avneri et al. | |
| 6,353,271 B1 | 3/2002 | Williams | 310/12 |
| 6,493,062 B1 * | 12/2002 | Tokuda et al. | 355/53 |
| 6,529,266 B1 * | 3/2003 | Sandstrom | 355/72 |
| 6,653,639 B1 * | 11/2003 | Novak | 250/491.1 |
| 6,844,635 B1 * | 1/2005 | Greene et al. | 310/12 |
| 6,885,435 B1 * | 4/2005 | Galburt | 355/72 |
| 2003/0098964 A1 | 5/2003 | Lee et al. | |
| 2003/0156270 A1 | 8/2003 | Hunter | |

FOREIGN PATENT DOCUMENTS

| | | |
|---|---|---|
| JP | 5-259024 | 10/1993 |
| WO | WO 97/29403 | 8/1997 |
| WO | WO 01/11431 A2 | 2/2001 |

\* cited by examiner

Primary Examiner—Henry Hung Nguyen
(74) Attorney, Agent, or Firm—Pillsbury Winthrop Shaw Pittman LLP

(57) ABSTRACT

A lithographic apparatus includes an illumination system for providing a beam of radiation and a support structure for supporting a patterning device. The patterning device serves to impart the beam with a pattern in its cross-section. The lithographic apparatus includes a substrate table for holding a substrate and a projection system for projecting the patterned beam onto a target portion of the substrate. The apparatus has a chuck system for supporting an object, such as the substrate or the patterning device, in the lithographic apparatus. The chuck system includes a chuck for supporting the object, a frame for supporting the chuck, and a chuck support structure for supporting the chuck relative to the frame. The chuck support structure includes at least one flexure element, which flexure element is flexible in at least one degree of freedom and is coupled to the chuck and the frame.

12 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a manufacturing process using a lithographic apparatus, the pattern has to be imaged on the substrate very accurately. The current lithographic projection apparatuses are commonly used to manufacture devices with typical dimensions in the micron or sub micron range. Hence, the pattern has to be imaged on the substrate with a corresponding accuracy.

For precise positioning and handling, in most known lithographic apparatuses, the substrate is supported, and (optionally) moved, relative to other parts in the lithographic apparatus by a substrate table. The table has a chuck system which is provided with a chuck. The chuck has a support surface on which the supported object, e.g. the substrate, can be clamped, in order to support the object. Furthermore, the known lithographic apparatus can be provided with a mask table which supports a mask. The mask table may also have a chuck system, which includes a chuck on which the mask can be mounted.

For example, from U.S. Pat. No. 6,353,271 a lithographic apparatus is known, which comprises a stage for precise positioning of a chuck in three orthogonal linear axes and in three orthogonal rotation axes. A substrate can be clamped on the chuck using an electrostatic force. The stage comprises a frame which supports the chuck. In this prior art document, the frame is implemented as a monolithic mirror block. The chuck is rigidly mounted on the monolithic mirror block. The monolithic mirror block is provided with mirrors that are part of an interferometer system that is used to determine the position of the chuck relative to other parts of the lithographic apparatus.

However, a drawback of the chuck system known from this prior art document is that the chuck may deform, for example due to heating during the lithographic projection process. The deformation of the chuck is transferred onto the frame or mirror block. Hence, the mirror block is deformed as well. This, inter alia, affects the accuracy of the interferometric measurements performed using the mirrors on the mirror block, which in turn affects the precision of positioning the substrate relative to the projection beam.

SUMMARY

An aspect of the present invention is to provide an improved lithographic apparatus. More specific, it is an aspect of the present invention to provide a lithographic apparatus in which deformation of the frame due to deformation of the chuck is at least reduced.

According to an aspect of the invention, there is provided a lithographic apparatus comprising: a projection system constructed to project a beam of radiation onto a target portion of a substrate; a patterning device constructed to impart a cross-section of the beam of radiation with a pattern; and a chuck system including, a chuck constructed to hold one of the substrate and the patterning device; a frame constructed to hold the chuck; and a chuck support structure operable between the chuck and the frame, and constructed to support the chuck relative to the frame, the chuck support structure including a flexure element coupled between the chuck and the frame, the flexure element being flexible in at least one degree of freedom.

In such a lithographic apparatus, global deformation of the chuck, such as bow, warp, expansion, or compression, is at least partially not transferred to the frame, because the chuck support structure at least partially inhibits transfer of the deformation from the chuck to the frame. The chuck support structure comprises a flexure element which is coupled to the chuck and the frame and is flexible in at least one degree of freedom. Accordingly, in case of a deformation of the chuck, the flexure element will flex and at least a part of the deformation is not transferred to the frame.

In an embodiment of the invention, at least one of the at least one flexure elements is resistant to deformation in a plane parallel to a direction of movement of the frame. Thereby, a displacement of the frame in the direction in which the at least one flexure element is rigid is transferred to the chuck, while a deformation of the chuck is absorbed by a flexure of the flexure element in the degree of freedom in which the flexure element is flexible.

In an embodiment of the invention, the chuck system further comprises at least one chuck support which supports the chuck with respect to the frame, and which chuck support extends in a spacing between the chuck and the frame. Thereby, deformation of the frame due to deformation of the chuck is reduced further, while the chuck is accurately positioned with respect to the frame, because changes in the chuck shape, such as expansion or deformation, can be received in the spacing, while the chuck is held in position relative to the frame by the chuck supports.

In an embodiment of the invention, the chuck support is resistant to deformation in at least one degree of freedom in which the flexure element is flexible. Thereby, the chuck is accurately held in position with respect to the frame, because the chuck support holds the chuck in position in one or more of the degrees of freedom in which the flexure element is flexible, while the flexure element fixates the position of the chuck in the other degrees of freedom.

In an embodiment of the invention, the chuck support is mechanically disconnected from the frame and/or the chuck. Thereby, the chuck is not mechanically connected to the frame, but may, for instance, be coupled using electrostatic forces and may be replaced without a complex replacement operation.

In an embodiment of the invention, the frame has a recess in which the chuck is positioned. Because of the recess, the surface of the chuck, or the surface of the object supported by the chuck and the surface of the frame can be substantially at the same level. Thus, if the position of the surface of the frame is determined the position of the chuck surface or the object supported by the chuck can be derived as well in an uncomplicated manner.

In an embodiment of the invention, the lithographic apparatus further comprises a chuck deformation predicting device capable of predicting a deformation of the chuck in at least one degree of freedom; and a projection adjuster device connected to the chuck deformation measuring device, which projection adjuster device is arranged for adjusting in response to a prediction signal outputted by the chuck deformation predicting device at least one of: a property of the projection beam, a position of a pattern in the patterned beam of radiation relative to the object or vice versa.

In such a lithographic apparatus, accurate corrections can be made, because the deformation of the chuck is not coupled to a deformation of the frame and accordingly the deformation can be predicted with a high degree of accuracy.

In an embodiment of the invention, the lithographic apparatus further comprises an illumination system for providing a projection beam of radiation; a support structure for supporting a patterning device, the patterning device serving to impart the projection beam with a pattern in its cross-section; and a substrate table for holding a substrate; and at least one of the support structure and the substrate table comprises at least one of the at least one chuck systems, for supporting the substrate and/or the patterning device.

In a lithographic apparatus according to this embodiment, the radiation beam can be projected with an increased accuracy onto the substrate, because deformation of the frames is reduced in the systems supporting elements which have a significant impact on the accuracy of projecting the radiation (i.e. the substrate and patterning device). Accordingly, the those elements can be position more precise with respect to each other and the minimal dimensions of the structures to be formed onto the substrate are improved.

According to a further aspect of the invention, there is provided a method of manufacturing a device, comprising: projecting a beam of radiation onto a target portion of a substrate; imparting a pattern to a cross-section of the beam of radiation to form a patterned beam using a patterning device; and supporting at least one of the substrate and the patterning device in a flexible manner by using a chuck system, the chuck system including a chuck to hold one of the substrate and the patterning device and a frame to hold the chuck, and providing flexible support in at least one degree of freedom between the chuck and the frame.

According to another aspect of the invention, a chuck system constructed to support an object in a lithographic apparatus, the chuck system comprising: a chuck constructed to hold the object; a frame constructed to hold the chuck; and a chuck support structure operable between the chuck and the frame and constructed to support the chuck relative to the frame, the chuck support structure including a flexure element, the flexure element being coupled between the chuck and the frame, and the flexure element being flexible in at least one degree of freedom.

According to another aspect of the invention, a lithographic apparatus is provided comprising: means for projecting a beam of radiation onto a substrate; means for forming a patterned beam of radiation by imparting a cross-section of the beam of radiation with a pattern; and flexible means for supporting one of the substrate and the means for forming a patterned beam in a flexible manner to provide at least one degree of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system (IL) may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
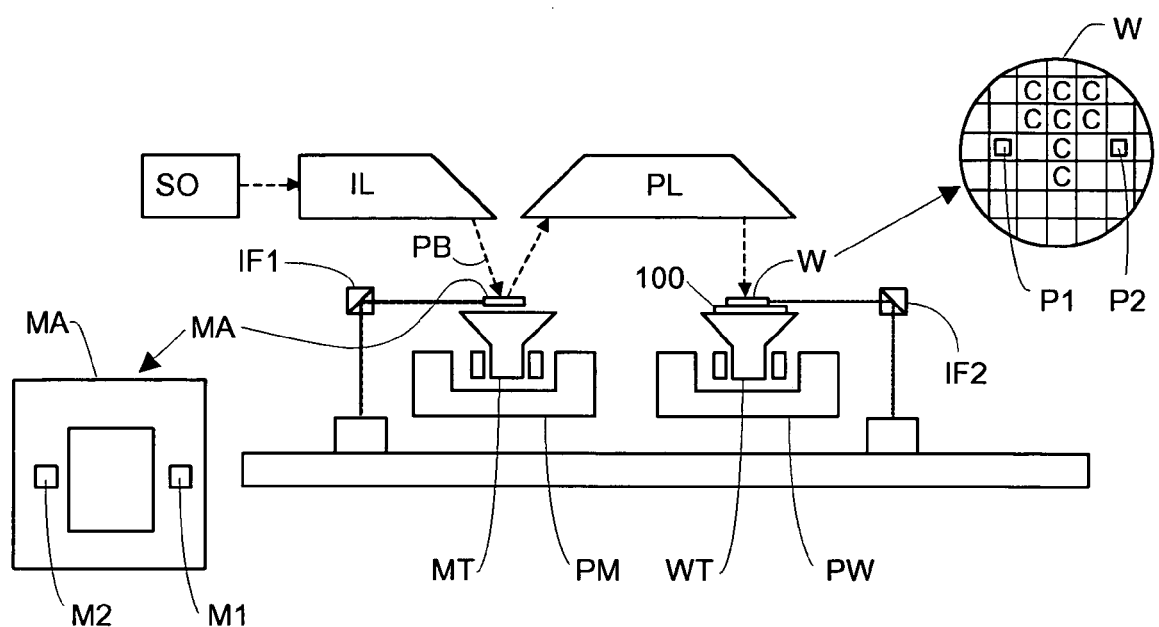
FIG. 1 depicts a lithographic apparatus according to an embodiment of the invention.

FIG. 1 schematically depicts a lithographic apparatus according to an embodiment of the invention. The apparatus comprises: an illumination system (IL) (illuminator) IL for providing a projection beam PB of radiation (e.g. UV or EUV radiation); a first support structure (e.g. a mask table) MT for supporting a patterning device (e.g. a mask) MA and connected to first positioning structure PM for accurately positioning the patterning device with respect to item PL; a substrate table (e.g. a wafer table) WT for holding a substrate (e.g. a resist-coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source so. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

In the example of FIG. 1, the substrate table WT is provided with chuck 120 on which the substrate W is clamped. The chuck 120 and the part of the substrate table WT which supports the chuck 120 are part of a chuck system according to an embodiment of the invention, such as for example the chuck system 100 shown in FIGS. 2–4. In the example of FIG. 1, the chuck system 100 is provided on the substrate table WT for support of the substrate W. However, a chuck system according to an embodiment of the invention may likewise be used to support other objects in a lithographic apparatus, such as the patterning device (e.g. the reticle or mask) and be provided on the mask table MT, for example.

Figure 2:
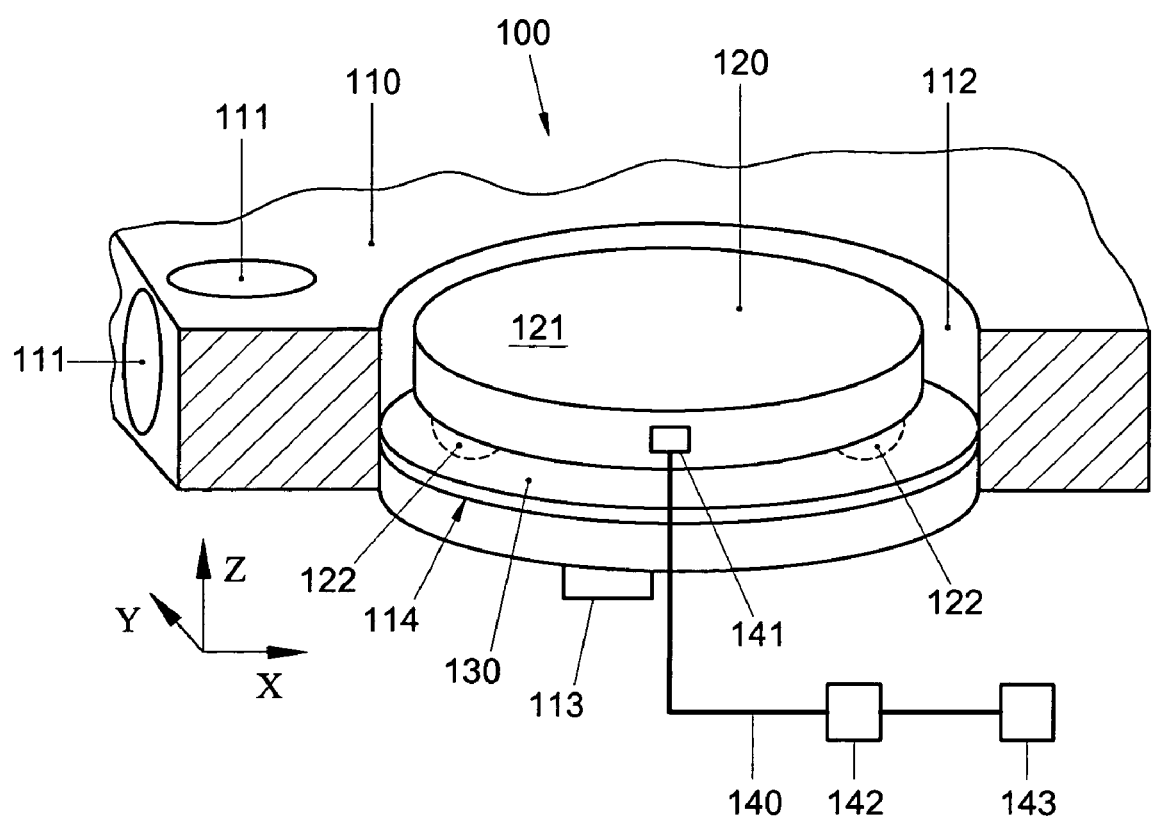
FIG. 2 shows a perspective, partially exploded view of an example of a chuck system according to an embodiment of the invention.

FIG. 2 schematically shows an example of a chuck system 100 suitable for use in the example of FIG. 1. In this example, the chuck system 100 comprises a frame 110, which may for instance be a part of the substrate table WT in the example of FIG. 1. In this example, the frame 110 is implemented as a mirror block and is provided with a number of mirrors 111 at different sides of the frame 110, which may be used in interferometric measurements to determine the position or the tilt of the frame 110, for example.

In this example, the frame 110 is provided with a driving device 113, arranged for positioning the frame 110 relative to other parts of the lithographic apparatus 1. The driving device 113 may for example comprise the long stroke and short stroke module as mentioned before.

The chuck system 100 further comprises a chuck 120. The chuck 120 has an object surface 121 on which an object, such as a wafer or a mask, may be mounted and clamped using a, not shown, clamping device. The clamping device may for example be an electrostatic clamping device which exerts an electrostatic force on the substrate or a vacuum system which provides a vacuum between the chuck and the substrate and thus exerts a vacuum force on the substrate or another type of clamping device. It should be noted that clamping devices for a chuck are generally known in the art and for the sake of brevity are not described in further detail.

In this example, in use, the object surface 121 is substantially horizontal and the substrate is vertically supported by the chuck 120. However, it is likewise possible to provide a chuck which has a substantially vertical object surface. A suitable shape for the chuck 120 may be rectangular for supporting masks or disk-shaped for supporting substrates. A chuck for supporting substrates may have a suitable diameter, for example between 10 and 45 cm. However, aspects of the invention are not limited to a specific shape or size and other shapes and sizes are likewise possible.

In the shown examples, the frame 110 further has a recess 112, in which the chuck 120 is positioned. Because of the recess 112, the surface 121 of the chuck 120, or the surface of the object supported by the chuck 120 and, what may be denoted as the top-surface of the frame 110 in the example of FIG. 2 can substantially be at the same level. Thus, if the position of the surface of the frame is determined, using the mirrors 111 for example, the position of the chuck 120 can easily be derived as well.

The chuck 120 is supported relative to the frame 110 by a chuck support structure 114 in a chuck support region of the frame 110. The chuck support structure 114 comprises a flexure element 130 which is flexible in at least one degree of freedom. The flexure element 130 is connected to the frame 110 and the chuck 120. The flexure element holds the chuck 120 in position with respect to the frame 110, and is deformable in at least one degree of freedom.

Figure 3:
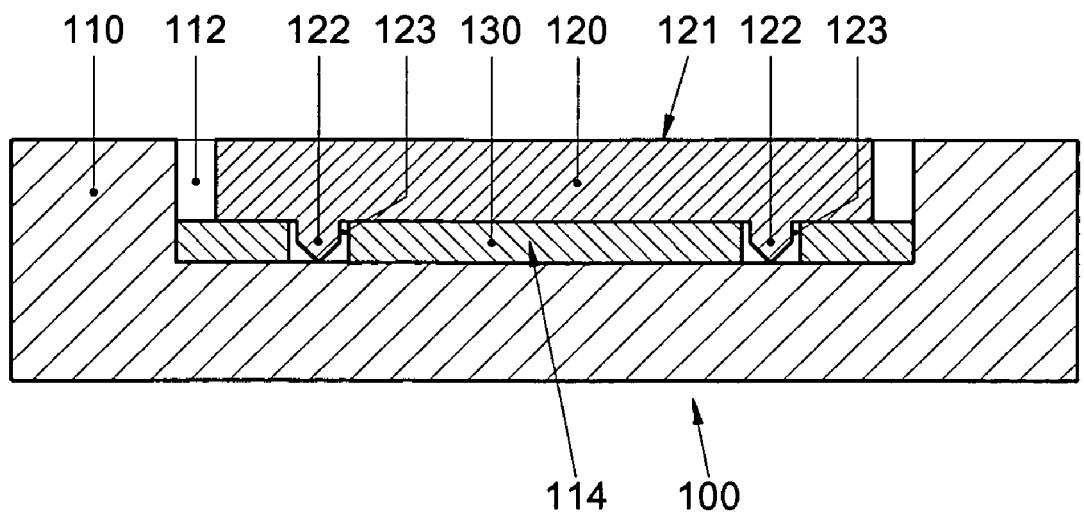
FIG. 3 shows a cross-sectional view of the example of a chuck system of FIG. 2.
Figure 4:
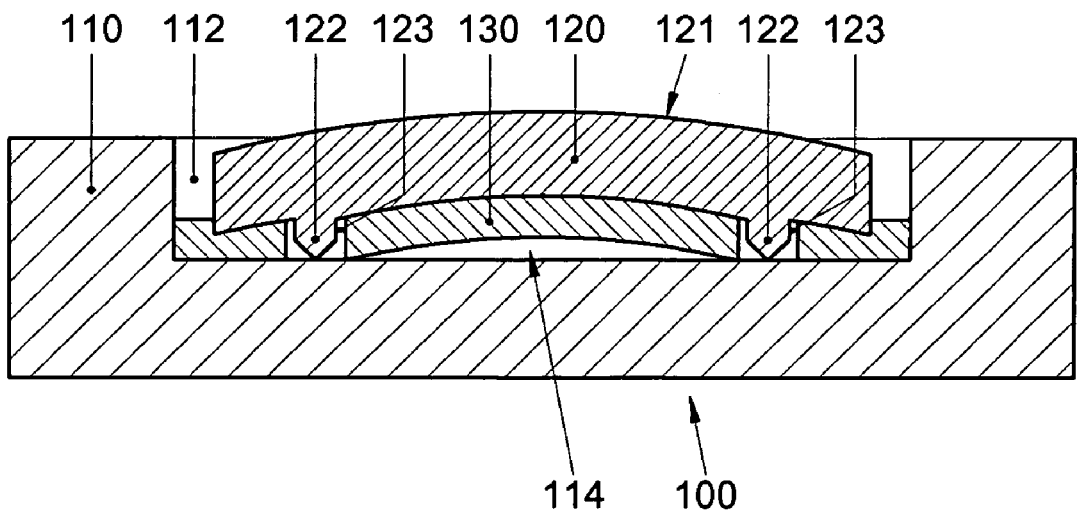
FIG. 4 shows a cross-sectional view of the example of a chuck system of FIG. 2 with the chuck in a deformed state.

As is illustrated in FIG. 3, in a normal state, the chuck 120 is flat. However, during operation of the lithographic apparatus 1, the chuck 120 may deform. This deformation may for example be caused by thermal deformation of the substrate W which is clamped on the chuck 120 or heating of the chuck 120 itself, which causes a bending of the chuck 120. FIG. 4 shows the chuck 120 in a spherically deformed state. As seen in FIG. 4, the deformation causes the chuck 120 to exert a force on the flexure element 130. Due to the force the flexure element 130 deforms in the dimension in which it is flexible, but the force exerted by the chuck 120 is not transferred to the frame 110. Thus, the frame 110 is not deformed by the chuck 120. Accordingly, if the frame 110 is used for performing measurements, such as interferometric position or tilt measurements using the mirrors 111 as shown in FIG. 2, the measurements are not affected by a deformation of the chuck 120.

In the examples shown, the flexure element 130 is deformable in at least one degree of freedom while substantially rigid in at least one other degree of freedom. Thereby, changes in position or shape in the direction in which the flexure element 130 is flexible are not transferred from the chuck 120 to the frame 110 or vice versa, while a displacement of the frame 110 in the direction in which the flexure element 130 is rigid is transferred of to the chuck 120. Thus, an accurate positioning of the chuck 120 can be obtained while transfer of a chuck deformation to the frame 110 and rotation of the chuck 120 around a vertical axis are prevented.

The flexure element(s) 130 may for example be rigid in a direction parallel to a direction of movement of the frame 110. For instance in FIG. 2, the flexure element 130 is substantially rigid in the plane parallel to the with axes x and y in FIG. 2, while flexible perpendicular to this plane, in the direction of the z-axis. The frame 110 can be moved in directions parallel to the plane defined by the axis x and y in FIG. 2 by the driving device 113, that is substantially parallel to the surface 121 of the chuck 120 on which the supported object is mounted. Thus, when the frame 110 is moved in the x and/or y direction, the movement is transferred to the chuck 120 substantially at the same moment, while deformation of the chuck 120 are absorbed by flexing of the flexure element 130 in the z-direction.

The chuck system 100 may be provided with further positioning structures for keeping the chuck 120 in position with respect to the frame 110, such as electronic, magnetic or electromagnetic sensor actuator systems for instance. Such positioning are generally known in the art of lithographic apparatuses and may for instance comprise Lorentz actuators, piezo-electric actuators or otherwise.

In the example of FIGS. 2–4, for holding the chuck 120 in position with respect to the frame 110, the chuck support structure 114 further comprises one or more chuck supports, in FIGS. 2–6 shown as struts 122, which support the chuck 120 with respect to the chuck support region of the frame 110, and hold the chuck 120 at a distance from the frame 110. A spacing is therefore present between the chuck 120 and the frame 110. Because of the spacing, expansion and/or deformation of the chuck 120 does not affect the frame 110, since such changes of the chuck 120 are received in the spacing.

In the example of FIGS. 2–4, the struts 122 are spike-shaped rigid extensions of the chuck 120 with a point-shaped end facing towards the frame 110. The struts 122 preferably form an integral part of the chuck 120 and are not connected to the frame 110. Thus, the chuck 120 and struts 122 form a self-supporting structure which is in contact with the frame 110 at the point-shaped ends of the struts 122 only. Thereby, the mechanical contact between the chuck 120 and the frame 110 is minimised and accordingly, transfer of deformation between the chuck 120 and the frame 110 is prevented.

Figure 5:
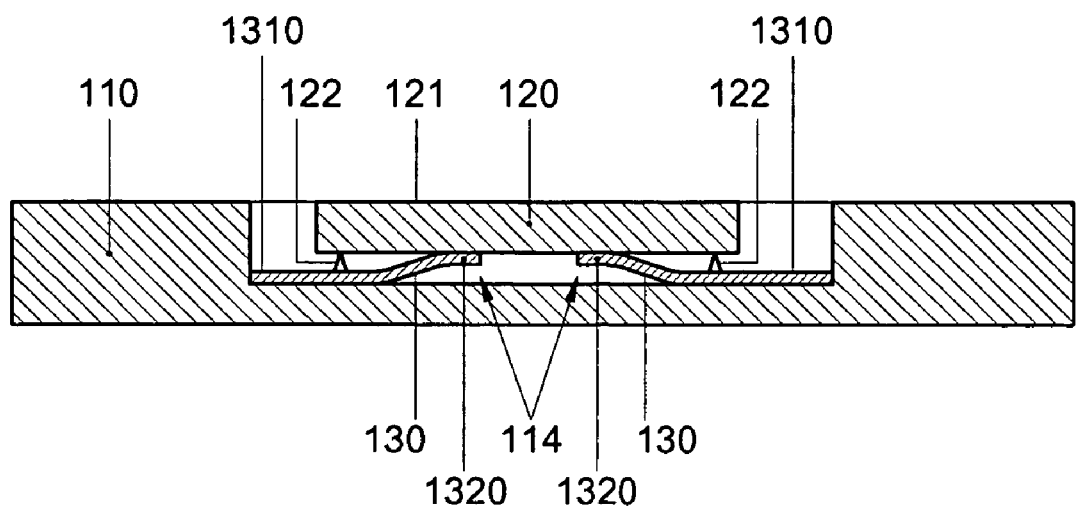
FIG. 5 shows a cross-sectional view of another example of a chuck system according to an embodiment of the invention, different from the example of FIGS. 2–4.

However, the struts 122 may also be connected to the frame 110 or be connected to the flexure element 130 only, as in the example of FIG. 5, for instance. In such case, the chuck 120 is not mechanically connected to the frame 110 and may be replaced without a complex replacement operation.

In the example of FIGS. 2–4, the struts 122 extend through holes 123 formed in the flexure element 130 and the struts 122 are in contact with the frame 110 by their point-shaped ends. In the example of FIG. 5, the struts 122 are positioned between the flexure elements 130 and the chuck 120 and not in contact with the frame 110.

In the example of FIGS. 2–4, the chuck 120 is provided with three struts 122 provided at the side 123 of the chuck 120 which faces the frame 110. Aspects of the invention are however not limited to this number of struts. The struts 122 are positioned at equal distances in a circumferential direction of the disk-shaped chuck 120. The struts 122 extend, in this example, through holes provided in the flexure element 130 towards the frame 110. The chuck 120 thus rests in a vertical direction on the struts 122.

Because three struts 122 are present, the chuck 120 is supported in the vertical direction in a statically determined manner. Thereby, tilting of the chuck 120 around a horizontal axis with respect to the frame 110 is prevented. Tilting of the chuck 120 can also be prevented by a chuck support structure which supports the chuck in a statically overdetermined manner, such as by four or more struts positioned at equal distances in a circumferential direction or otherwise.

The chuck support structure 114 may also connect the frame 110 to the chuck 120 in a kinematically determined or overdetermined manner in other dimensions to prevent rotation or tilt in other directions. To that end, the chuck support structure 114 may, as in the example of FIGS. 2–4, comprise a flexure element 130 which is substantially rigid in at least one dimension. Also, struts may be provided which are rigid in a direction in which the flexure element 130 is flexible, to provide a good fixation of the chuck 120, while maintaining the deformation inhibition provided by the flexure element 130.

In the example of FIGS. 2–4, the flexure element 130 extends, at least partially, substantially completely in the spacing between the chuck 120 and the frame 110. Thereby, the footprint of the chuck system 100 is reduced because the frame area occupied by support structure 114 at least partially coincides with the frame area occupied by the chuck 120.

In the example of FIGS. 2–4, the flexure element 130 extends along substantially the whole side of the chuck 120 facing the frame 110. However, the flexure element 130 may also be implemented differently. For instance in the example of FIG. 5, the chuck support structure 114 comprises two or more separate leaf springs 130, each connected with a first leaf end 1310 of the leaf spring to the frame 110 and with a second leaf end 1320 to the chuck 120, while the second leaf ends 1320 are at a distance from each other.

Figure 6:
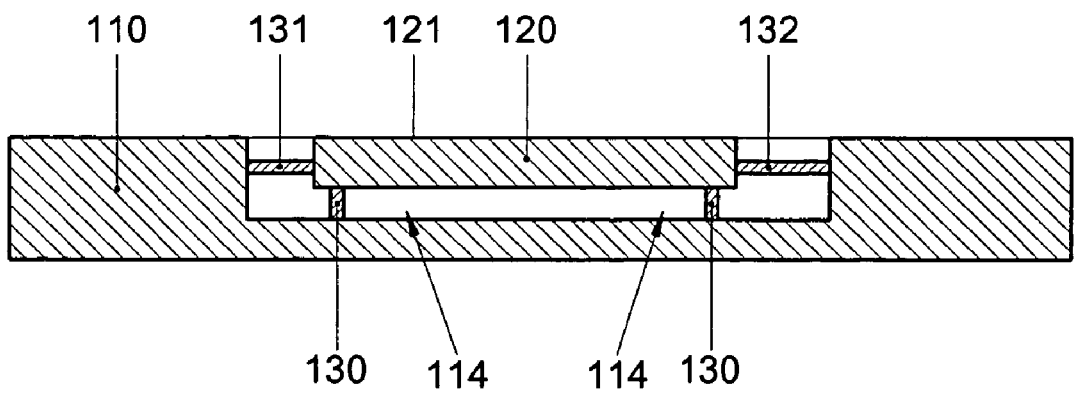
FIG. 6 shows a cross-sectional view of another example of a chuck system according to an embodiment of the invention different from the example of FIGS. 2–4 and the example of 5.

In the example of FIG. 6, the chuck 120 is attached by a number of flexure elements 130 to the frame 110. A first flexure element 130 supports the chuck 120 in a vertical direction with respect to the frame 110, whereas a second flexure elements 131 are attached to the sides of the chuck 120. The second flexure elements 131 prevent tilting of the chuck 120 around a horizontal axis and provide further stability to the chuck 120. The first flexure elements 130 may be regarded as chuck supports which are resistant to deformation in the vertical direction and flexible in one or more other dimensions.

FIGS. 7A–D show some examples of leaf spring configurations suitable for implementation as a flexure element in a chuck system according to an embodiment of the invention.

Figure 7A:
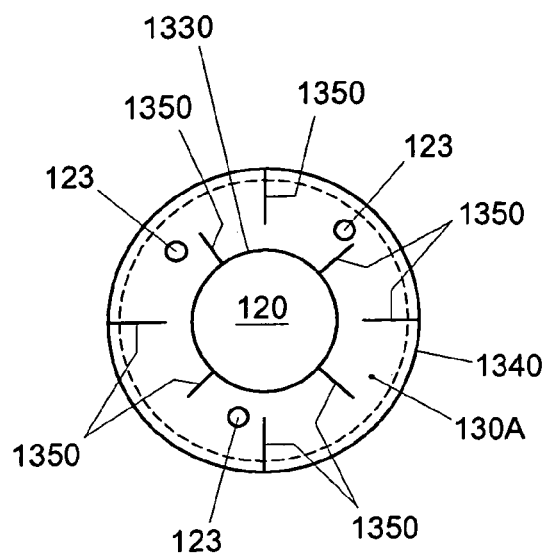
FIGS. 7A–C show examples of flexure elements suitable for use in an example of a chuck system according to an embodiment of the invention.

The leaf spring 130A of FIG. 7A has an annular shape with a inner circumferential edge 1330 and an outer circumferential edge 1340. The leaf spring 130A is provided with slots 1350 extending in a radial direction from both edges 1330, 1340. The leaf spring 130A is connected at the inner circumferential edge 1330 to the chuck 120 and can be connected to the frame 110 at the outer circumferential edge 1340. As shown in FIG. 7A, the spring 130A can be provided with holes 123 in which struts 122 can extend.

Figure 7B:
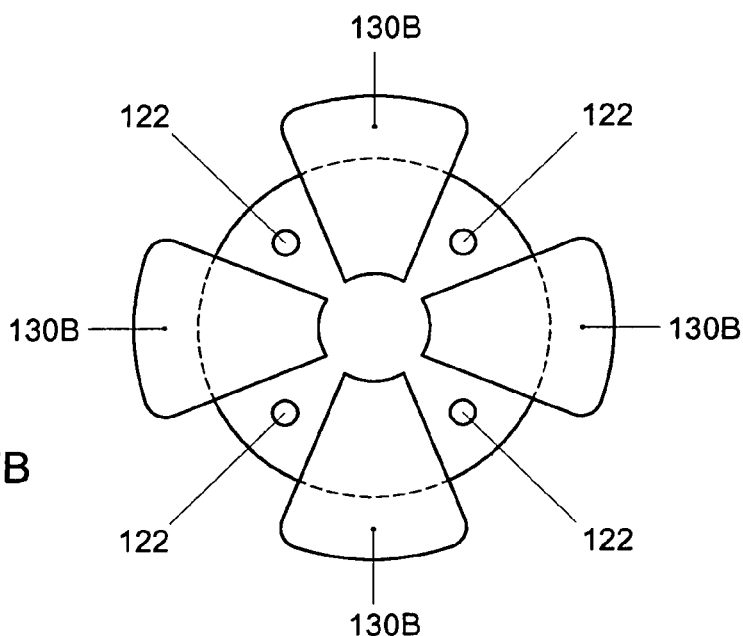

FIG. 7B shows a configuration of a flexure element, comprising of a plurality, in this example four, separate leaf springs 130B positioned in a radial arrangement with a spacing in the circumferential direction between the leaf springs 130b. The radially inward projecting ends of the leaf springs 130B are connected to the chuck 120, while the radially outward projecting ends of the springs 130B can be connected to the frame 110. The struts 122 are positioned in the spacing between the springs 130B.

Figure 7C:
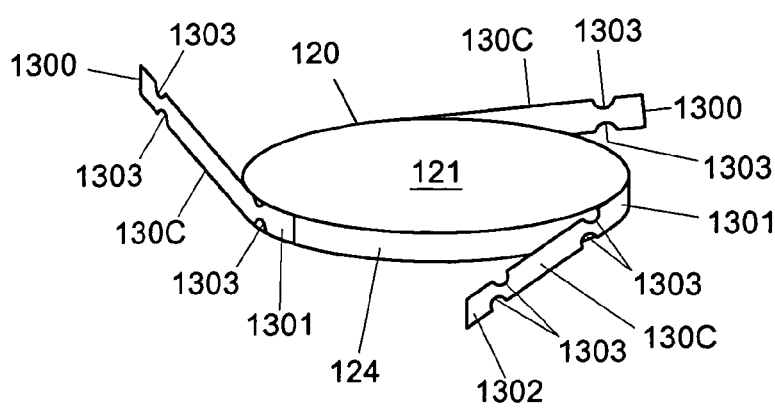

FIG. 7C shows a perspective view of a chuck 120 with leaf springs 130C connected with one end 1301 to a side 124 perpendicular to the support surface 121 of the chuck 120 and connectable with another end 1300 to the frame 110. The leaf springs 130C extend from the circumference of the chuck 120 in a tangential direction. The leaf springs 130C are locally weakened by cut-aways 1303, in order to provide the leaf spring 130C with flexibility in a traverse direction.

It should be noted that the flexure element 130 may also be implemented in a different manner than shown in the figures and for example comprise an elastic membrane or otherwise. The flexure element 130 may for example be may of a material similar to the material of at least one of the chuck 120 and the frame 110 are manufactured from. Such a flexure element has characteristics similar to the characteristics of other parts of the chuck system 100 and thus differing conditions affect different parts of the chuck system 100 in a corresponding manner. However, the flexure element 130 may also be made of a different material.

Alternatively, the flexure element 130 may be connected to the frame 110 and the chuck 120 by any connection suitable for the specific implementation. For instance, if the lithographic apparatus uses EUV radiation, the flexure element 130 may be clamped by an electro-static clamping device to the frame 110. However, other connecting techniques such as gluing, welding or otherwise may likewise be used.

Because of the flexure element 130, the deformation of the chuck 120 and/or the substrate W mounted on the chuck 120 does not deform the frame 110. Thereby, the deformation of the substrate W and/or the chuck 120 is not dependent on the properties of the frame 110. Hence, the deformation of the substrate W and/or the chuck 120 may be predicted with a large degree of accuracy for different types of chuck systems.

As is schematically indicated in FIG. 2, the chuck system 100 may be provided with a chuck deformation prediction device 140. In the example of FIG. 2, the prediction device 140 comprises a deformation measuring device which can measure, with a sensor 141, a quantity which is related to a deformation of the chuck 120 and/or the substrate W in at least one degree of freedom, such as the temperature, the exposure energy of the radiation incident on the substrate W, the number of preceding substrates illuminated in the lithographic apparatus or another measured quantity, the deformation itself.

The sensor 141 can output a signal representing a value of the measured quantity to a calculator 142 which calculates a deformation of the chuck 120 and/or the substrate W from the measured quantity. The calculator 142 may for example be provided with a memory in which reference values for the deformation and the measured quantity are stored and a search device which looks-up the deformation corresponding to the measured value. The calculator may then output a deformation signal which represents a property the calculated deformation, such as the curvature of the chuck 120 for example, to an actuator 143. The actuator 143 may in response to the deformation signal adjust one or more properties of the projection beam, such as for example the magnification or the translation of the projected pattern perpendicular to the optical axis, e.g. parallel to the plane of the supported object or rotation of the projected pattern around the optical axis.

The chuck deformation prediction device 140 may also be implemented differently, and for example comprises a processor device which based on data stored in a memory predicts a deformation of the chuck and provides a prediction signal to the actuator 143 without actual measurement to the chuck 120, or any other suitable configuration.

While specific embodiments of the invention have been described above, it will be appreciated that aspects of the invention may be practiced otherwise than as described. The description is not intended to limit aspects of the invention.

What is claimed is:

1. A lithographic apparatus comprising:
    a projection system constructed to project a beam of radiation onto a target portion of a substrate;
    a patterning device constructed to impart a cross-section of said beam of radiation with a pattern; and
    a chuck system including,
        a chuck constructed to hold one of said substrate and said patterning device;
        a frame constructed to hold said chuck, said frame being movable relative to the projection system; and
        a chuck support structure operable between said chuck and said frame, and constructed to support said chuck relative to said frame, said chuck support structure including a flexure element coupled between said chuck and said frame, said flexure element being flexible in at least one degree of freedom and resistant to deformation in a plane parallel to a direction in which said frame is movable.

2. A lithographic apparatus according to claim 1, wherein said chuck support structure extends in a spacing between said chuck and said frame.

3. A lithographic apparatus according to claim 2, wherein said flexure element extends at least partially in said spacing.

4. A lithographic apparatus according to claim 1, wherein said chuck support structure is resistant to deformation in a direction in which said flexure element is flexible.

5. A lithographic apparatus according to claim 1, wherein said chuck support structure is mechanically disconnected and separate from at least one of said frame and said chuck.

6. A lithographic apparatus according to claim 1, further comprising:
    a chuck deformation prediction device constructed to predict a deformation of said chuck in at least one degree of freedom; and
    a projection adjustment device connected to said chuck deformation prediction device, said projection adjustment device being constructed to adjust in response to a prediction signal outputted by said chuck deformation prediction device at least one of a property of said beam of radiation and a position of a pattern in said patterned beam of radiation relative to said object.

7. A lithographic apparatus according to claim 1, wherein said frame has a recess and said chuck is positioned in said recess.

8. A lithographic apparatus according to claim 1, further comprising:
    an illumination system constructed to provide said beam of radiation;
    a patterning device support structure constructed to support said patterning device; and
    a substrate table for holding said substrate;
    at least one of said patterning device support structure and said substrate table including said chuck system.

9. A method of manufacturing a device, comprising:
    projecting a beam of radiation onto a target portion of a substrate with a projection system;
    imparting a pattern to a cross-section of the beam of radiation to form a patterned beam using a patterning device; and
    supporting at least one of the substrate and the patterning device in a flexible manner by using a chuck system, the chuck system including a chuck to hold one of the substrate and the patterning device and a frame movable relative to the projection system to hold the chuck, and providing flexible support in at least one degree of freedom between the chuck and the frame and resisting deformation in a plane parallel to a direction in which said frame is movable.

10. A method according to claim 9, further comprising:
    predicting deformation of the chuck; and
    adjusting one of a property of the beam of radiation and a position of a pattern in the patterned beam in response to the predicted deformation of the chuck.

11. A chuck system constructed to support an object in a lithographic apparatus, said chuck system comprising:
    a chuck constructed to hold the object;
    a frame constructed to hold said chuck, said frame being configured to be movable within the lithographic apparatus; and a chuck support structure operable between said chuck and said frame and constructed to support said chuck relative to said frame,
said chuck support structure including a flexure element, said flexure element being coupled between said chuck and said frame, and said flexure element being flexible in at least one degree of freedom and resistant to deformation in a plane parallel to a direction in which said frame is movable.

12. A chuck system according to claim 11, wherein
said object is one of a substrate and a patterning device constructed to impart a cross-section of a beam of radiation with a pattern.

* * * * *